(12) United States Patent
Iwai et al.

(10) Patent No.: US 9,465,308 B2
(45) Date of Patent: Oct. 11, 2016

(54) IMPRINT APPARATUS, IMPRINT METHOD AND METHOD OF MANUFACTURING AN ARTICLE

(71) Applicant: CANON KABUSHIKI KAISHA, Tokyo (JP)

(72) Inventors: Toshiki Iwai, Utsunomiya (JP); Ken-ichiro Shinoda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 25 days.

(21) Appl. No.: 14/568,723

(22) Filed: Dec. 12, 2014

(65) Prior Publication Data

US 2015/0192515 A1   Jul. 9, 2015

(30) Foreign Application Priority Data

Jan. 6, 2014   (JP) ................ 2014-000651

(51) Int. Cl.
   *G03B 27/42*   (2006.01)
   *G03F 9/00*    (2006.01)

(52) U.S. Cl.
   CPC .......... *G03F 9/7088* (2013.01); *G03F 9/7015* (2013.01); *G03F 9/7038* (2013.01)

(58) Field of Classification Search
   CPC ................... G03F 7/70002; G03F 9/7088
   USPC .................................. 355/53, 55
   See application file for complete search history.

(56) References Cited

U.S. PATENT DOCUMENTS

| 8,842,294 B2 | 9/2014 | Minoda et al. |
| 8,967,991 B2 | 3/2015 | Wuister et al. |
| 2005/0105093 A1 | 5/2005 | Tokita |
| 2011/0062623 A1 | 3/2011 | Saito |
| 2011/0141489 A1* | 6/2011 | Sato ........................ G01B 11/02 356/618 |
| 2013/0300031 A1 | 11/2013 | Torii et al. |
| 2013/0313744 A1* | 11/2013 | Maruyama ............ G03F 7/0002 264/40.1 |
| 2015/0013559 A1 | 1/2015 | Hayashi |

FOREIGN PATENT DOCUMENTS

| JP | 04056312 A | 2/1992 |
| JP | 2007281072 A | 10/2007 |
| JP | 4478424 B2 | 6/2010 |
| JP | 2011003605 A | 1/2011 |
| JP | 2011029642 A | 2/2011 |

(Continued)

OTHER PUBLICATIONS

Office Action issued in JP2014-000651, mailed Nov. 30, 2015.

*Primary Examiner* — Hung Henry Nguyen
(74) *Attorney, Agent, or Firm* — Rossi, Kimms & McDowell LLP

(57) ABSTRACT

The present invention provides an imprint apparatus including a control unit configured to perform detection process, wherein the detection process includes first process in which a detection optical system is caused to detect a mold-side mark in a state in which a substrate state is positioned such that a reference mark is located outside the field of view of the detection optical system, and second process in which the detection optical system is caused to detect the reference mark in a state in which the mold stage is positioned such that the mold-side mark is out of focus with respect to the detection optical system, and the substrate stage is positioned such that the reference mark is located inside the field of view of the detection optical system.

12 Claims, 10 Drawing Sheets

(56) References Cited

FOREIGN PATENT DOCUMENTS

| JP | 2011066238 A | 3/2011 |
|---|---|---|
| JP | 2013030757 A | 2/2013 |
| JP | 2013157553 A | 8/2013 |
| JP | 2013219333 A | 10/2013 |
| JP | 2013243315 A | 12/2013 |
| JP | 2013254938 A | 12/2013 |

* cited by examiner

F I G. 2
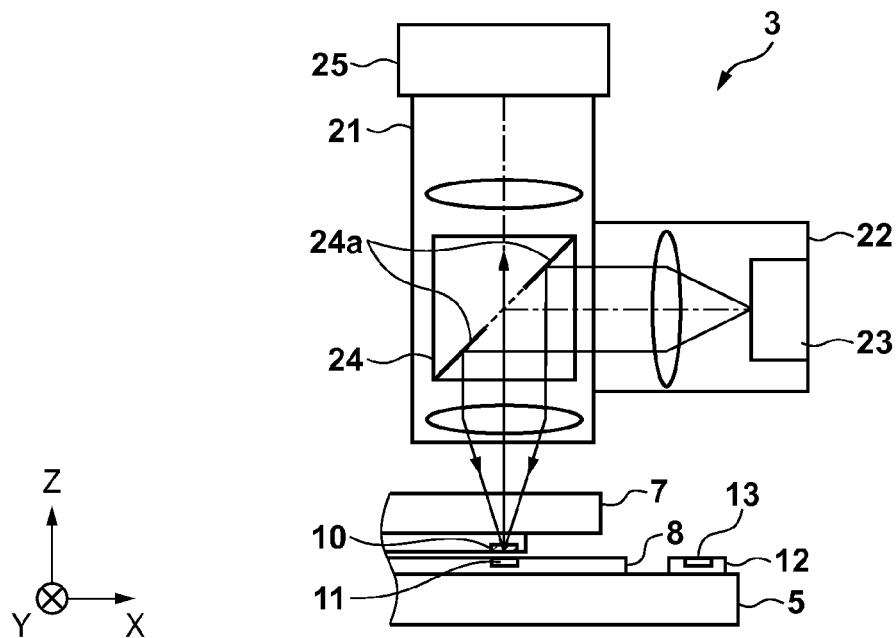
F I G. 3
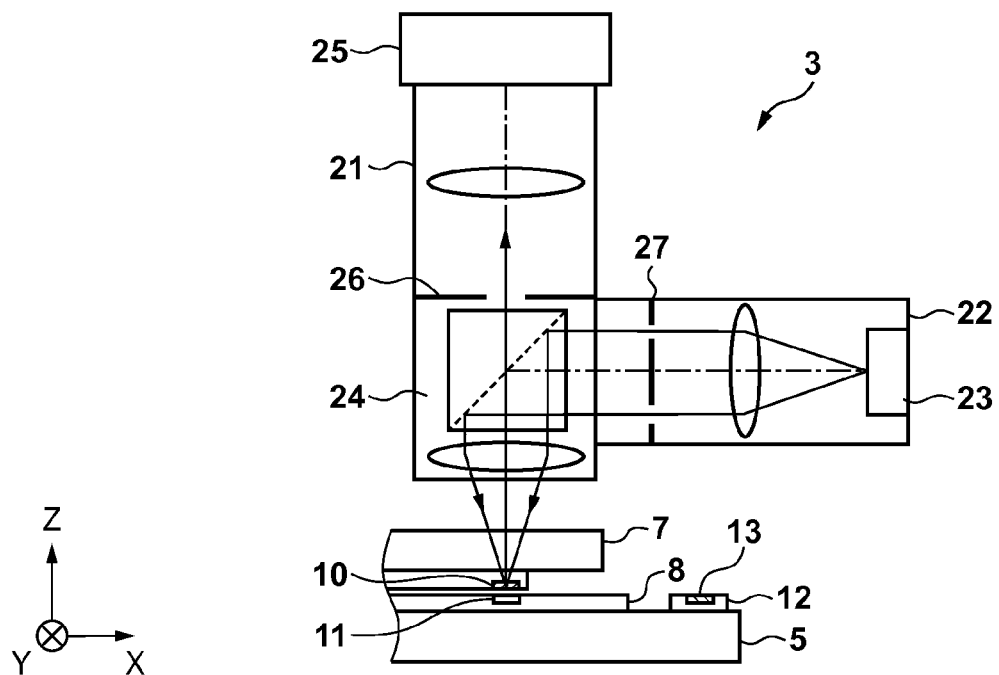

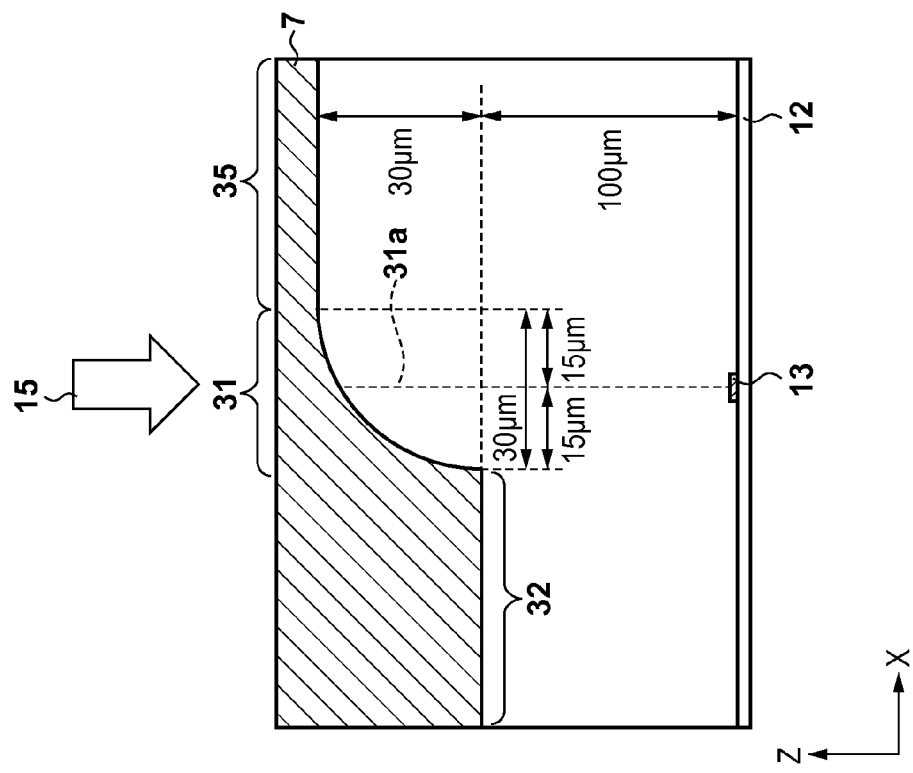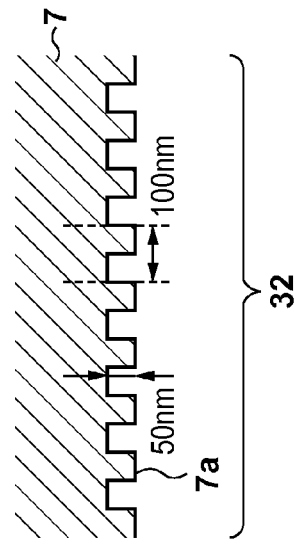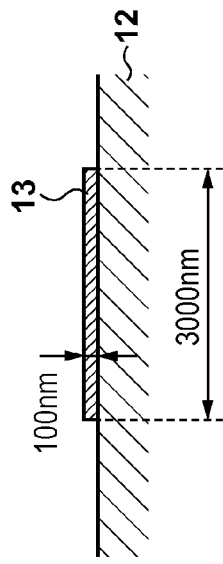

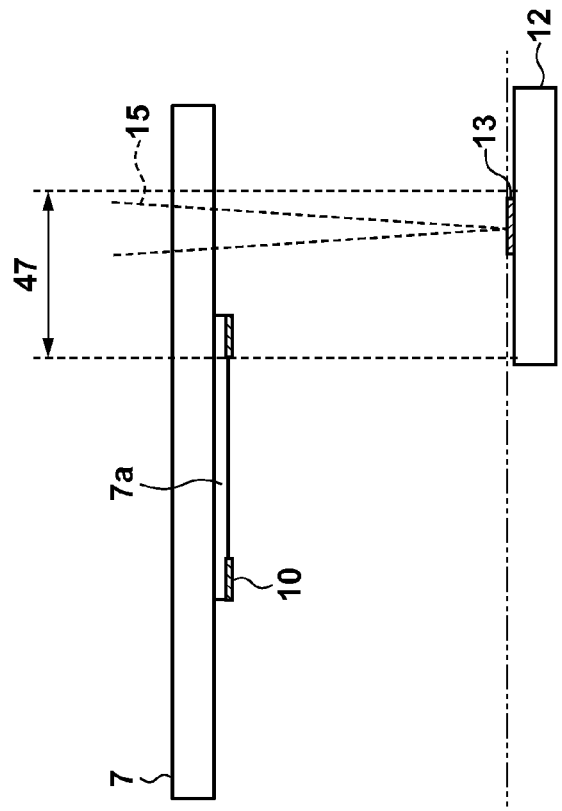
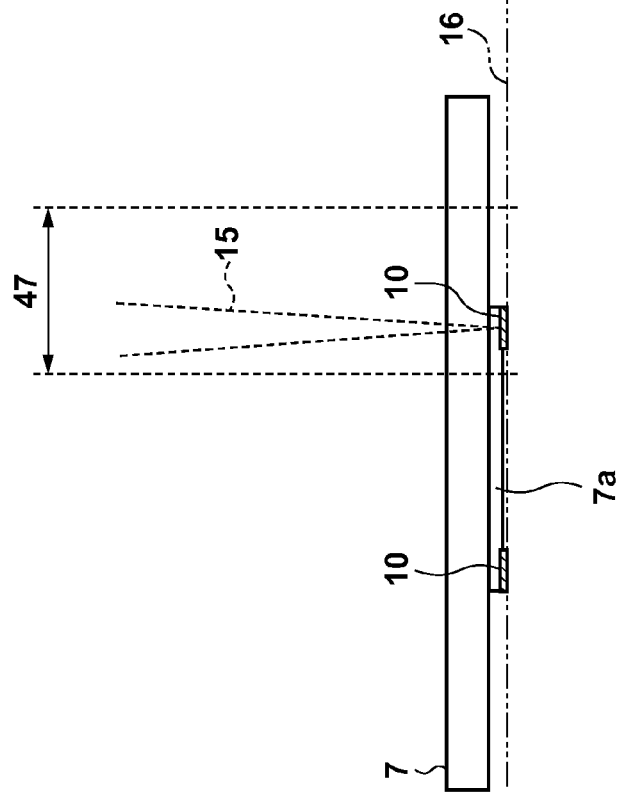

IMPRINT APPARATUS, IMPRINT METHOD AND METHOD OF MANUFACTURING AN ARTICLE

BACKGROUND OF THE INVENTION

1. Field of the Invention

The present invention relates to an imprint apparatus, an imprint method, and a method of manufacturing an article.

2. Description of the Related Art

Demand for smaller semiconductor devices has increased, and in addition to conventional photolithography techniques, attention has been given to imprint technology according to which an imprint material (uncured resin) on a substrate is molded using a mold (die) so as to form a resin pattern on the substrate. Imprint technology makes it possible to form microstructures on the order of several nanometers on a substrate. Photocuring is known as one example of imprint technology.

With an imprint apparatus that employs photocuring, first, photocurable resin (e.g., ultraviolet curable resin) is applied to a shot region on a substrate, and this resin is molded using a mold. The resin is then cured by being irradiated with light (e.g., ultraviolet light), and the mold is then separated (detached), and thus a resin pattern is formed on the substrate.

This type of imprint apparatus is disclosed in Japanese Patent No. 4478424, and includes a substrate stage for positioning a substrate, an alignment substrate that is arranged on the substrate stage and includes a reference alignment mark formed thereon, and an alignment detection system, for example. The alignment detection system detects misalignment between the reference alignment mark and an alignment mark formed on the mold, for example. Alignment of the mold and the substrate can be performed based on the detection results from the alignment detection system.

However, in conventional imprint apparatuses, when detecting misalignment between the reference alignment mark and the alignment mark formed on the mold with the alignment detection system, it is necessary to bring the mold and the alignment substrate close together (i.e., reduce the gap between the mold and the alignment substrate) when detecting the alignment marks. Accordingly, if a foreign particle exists on the alignment substrate, there is a possibility of the mold becoming damaged due to coming into contact with the foreign particle (i.e., the foreign particle is sandwiched between the mold and the alignment substrate).

SUMMARY OF THE INVENTION

The present invention provides technology advantageous to the detection of a mold-side mark provided on a mold and a reference mark provided on a substrate stage.

According to one aspect of the present invention, there is provided an imprint apparatus that performs imprint process for forming a pattern on an imprint material on a substrate using a mold, the imprint apparatus including a mold stage configured to hold the mold, a substrate stage configured to hold the substrate, a detection optical system configured to detect a mold-side mark provided on the mold and a reference mark arranged on the substrate stage, a control unit configured to perform detection process by controlling positioning of the mold stage and the substrate stage and detection performed by the detection optical system, and a processing unit configured to perform the imprint process based on a detection result from the detection optical system, wherein the detection process includes first detection process in which the detection optical system is caused to detect the mold-side mark in a state in which the substrate stage is positioned such that the reference mark is located outside the field of view of the detection optical system, and second detection process in which the detection optical system is caused to detect the reference mark in a state in which the mold stage is positioned such that the mold-side mark is out of focus with respect to the detection optical system, and the substrate stage is positioned such that the reference mark is located inside the field of view of the detection optical system.

Further aspects of the present invention will become apparent from the following description of exemplary embodiments with reference to the attached drawings.

BRIEF DESCRIPTION OF THE DRAWINGS

FIG. 2 is a schematic diagram showing an example of a configuration of a detection optical system of the imprint apparatus shown in FIG. 1.

FIG. 3 is a schematic diagram showing another example of a configuration of the detection optical system of the imprint apparatus shown in FIG. 1.

FIGS. 5A to 5C are diagrams for describing a reduction in alignment mark detection light amount due to a step in a mold.

FIGS. 8A and 8B are diagrams for describing alignment of a mold and an alignment substrate according to an embodiment.

DESCRIPTION OF THE EMBODIMENTS

Figure 1:
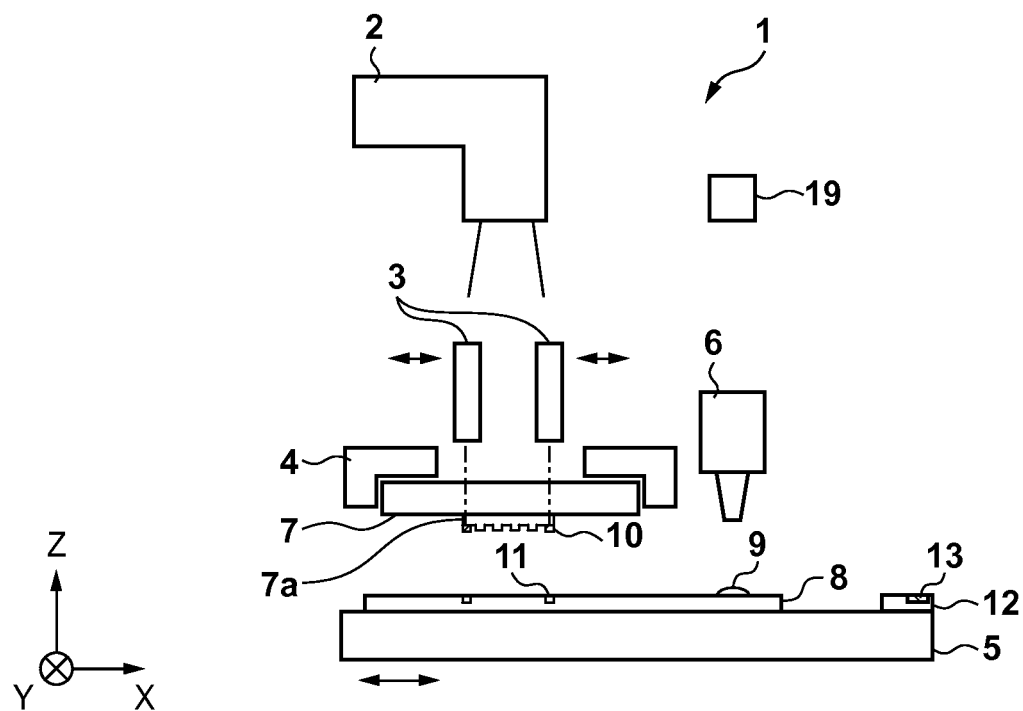
FIG. 1 is a schematic diagram showing a configuration of an imprint apparatus according to an aspect of the present invention.

Preferred embodiments of the present invention will be described below with reference to the accompanying drawings. Note that the same reference numerals denote the same members throughout the drawings, and a repetitive description thereof will not be given.

First Embodiment

FIG. 1 is a schematic diagram showing the configuration of an imprint apparatus 1 according to an aspect of the present invention. The imprint apparatus 1 is a lithography apparatus that performs imprint process for using a mold (die) to form a pattern in an imprint material (uncured resin) on a substrate. As shown in FIG. 1, the imprint apparatus 1 includes an irradiation unit 2, a detection optical system 3, a mold stage 4, a substrate stage 5, a resin supply mechanism 6, and a control unit 19. In the following, the X axis direction and the Y axis direction are directions that are orthogonal to each other in a plane parallel to the substrate and the mold, and the Z axis direction is the direction that is perpendicular to the X axis and the Y axis.

The irradiation unit 2 includes a light source and a plurality of optical elements, and emits light for curing resin 9 on a substrate 8 in a state in which the resin 9 is in contact with a mold 7 that includes a mesa region provided with a concave-convex pattern 7a (relief pattern) that corresponds to the pattern (e.g., circuit pattern) to be formed in the substrate 8. The irradiation unit 2 uniformly irradiates the mold 7, specifically the mesa region (irradiated face) in which the concave-convex pattern 7a is formed, with light that is emitted from the light source with a predetermined shape.

The irradiation region (irradiation range) of the light from the irradiation unit 2 need only be, for example, a region with roughly the same area as the mesa region in which the concave-convex pattern 7a is formed, or a region with a slightly larger area than the mesa region in which the concave-convex pattern 7a is formed. This is for reducing the irradiation region of the light from the irradiation unit 2 to the minimum necessary size in order to suppress misalignment and distortion in the pattern to be transferred to the resin 9 due to expansion of the mold 7 and the substrate 8 caused by heat from irradiation with light. This also for suppressing abnormalities in the operation of the resin supply mechanism 6 caused by light reflected by the substrate 8 or the like reaching the resin supply mechanism 6 and curing residual resin 9 in the resin ejection opening of the resin supply mechanism 6.

A high-pressure mercury lamp, various excimer lamps, an excimer laser, a light emitting diode, or the like can be used as the light source of the irradiation unit 2. Since ultraviolet curable resin, which is cured when irradiated with ultraviolet light, is used in the present embodiment, ultraviolet light is emitted from the light source of the irradiation unit 2. Note that the light (e.g., wavelength thereof) to be emitted from the light source of the irradiation unit 2 is determined according to the type of resin 9.

The detection optical system 3 detects various marks in order to relatively align the mold 7 and the substrate 8. For example, the detection optical system 3 optically detects an alignment mark 10 provided on the mold 7 (a mold-side mark) and an alignment mark 11 provided on the substrate 8. This makes it possible to obtain the relative positions of the mold 7 (alignment mark 10) and the substrate 8 (alignment mark 11). The detection optical system 3 is arranged such that the optical axis thereof is perpendicular to the mold 7 or the substrate 8. Also, the detection optical system 3 is arranged so as to be capable of moving in the X axis direction and the Y axis direction according to the position of a mark such as an alignment mark. Furthermore, the detection optical system 3 is arranged so as to be capable of moving in the Z axis direction as well, in order to match the focal plane (focal point) with the position of a mark such as an alignment mark.

The mold stage 4 includes a mold chuck that holds the mold 7 by attraction using vacuum suction force or electrostatic force. The mold stage 4 includes a mold driving mechanism for pressing the mold 7 against resin 9 that has been supplied to the substrate 8. The mold driving mechanism moves the mold stage 4 (the mold 7) in the Z axis direction. Also, a mold shape correction unit that corrects distortion of the concave-convex pattern 7a (the shape of the mold 7) by deforming the mold 7 in the X axis direction and the Y axis direction is arranged on the mold stage 4. The mold shape correction unit corrects the shape of the mold 7 based on the relative positions of the mold 7 and the substrate 8 under control of the control unit 19.

The substrate stage 5 includes a substrate chuck that holds the substrate 8 using vacuum suction force or electrostatic force. The substrate stage 5 includes a substrate driving mechanism for moving the substrate stage 5 (the substrate 8) in the X axis direction and the Y axis direction (for enabling movement in the XY plane).

An alignment substrate (reference plate) 12 is arranged on the substrate stage 5. An alignment mark (reference mark) 13 is provided on the alignment substrate 12, and the alignment mark 13 can be positioned in the detectable region (field of view) of the detection optical system 3 by moving the substrate stage 5. Accordingly, the detection optical system 3 can detect the alignment mark 13 provided on the alignment substrate 12 as well. This makes it possible to align the mold 7 and the alignment substrate 12, that is to say align the mold 7 and the substrate stage 5.

In the present embodiment, an imprint operation (operation for bringing the mold 7 into contact with the resin 9) and a mold separation operation (operation for detaching the mold 7 from the resin 9) performed by the imprint apparatus 1 are realized by moving the mold stage 4 (the mold 7) in the Z axis direction. Note that the imprint operation and the mold separation operation may be realized by moving the substrate stage 5 (the substrate 8) in the Z axis direction or moving both the mold stage 4 and the substrate stage 5 in the Z axis direction.

The resin supply mechanism 6 (dispenser) includes a nozzle that includes a resin ejection opening, for example, and supplies (applies) resin 9 to the substrate 8. The resin supply mechanism 6 does not need to be arranged inside the imprint apparatus 1, and may be arranged outside the imprint apparatus 1. For example, a configuration is possible in which a substrate 8 to which resin 9 has been applied in advance by an external resin supply mechanism is conveyed to the imprint apparatus 1. According to this configuration, the step for supplying the resin 9 inside the imprint apparatus 1 is eliminated, thus making it possible to reduce the time required for process performed by the imprint apparatus 1 (imprint process). Also, the need for the resin supply mechanism 6 is eliminated, thus making it possible to suppress the overall cost of the imprint apparatus 1.

The surface of the mold 7 that opposes the substrate 8 includes a mesa region in which the concave-convex pattern 7a is formed, and an off-mesa region that surrounds the mesa region. In order for light from the irradiation unit 2 to pass through the mold 7 and irradiate the resin 9, the mold 7 is constituted by a material that transmits light from the irradiation unit 2, such as quartz. In the mold 7, the off-mesa region is the region in which the concave-convex pattern 7a is not formed, and the mesa region is structured so as to protrude from the off-mesa region toward the substrate 8.

Accordingly, only the mesa region of the mold 7 comes into contact with the resin 9 on the substrate 8 in the imprint operation.

The substrate 8 includes a glass plate, a wafer made of single crystal silicon, or the like. Resin 9 is supplied to the upper surface of the substrate 8 by the resin supply mechanism 6. Although the resin 9 is ultraviolet curable resin that is cured when irradiated with ultraviolet light in the present embodiment, the type of resin 9 is selected according to the type of semiconductor device, for example.

The control unit 19 includes a CPU, a memory, and the like, and performs overall control of the imprint apparatus 1. The control unit 19 performs imprint process (functions as a processing unit) for forming a pattern on a substrate by controlling units of the imprint apparatus 1. Also, as will be described later, the control unit 19 performs detection process by controlling the positioning of the mold stage 4 and the substrate stage 5 and detection by the detection optical system 3 in the alignment of the mold 7 and the substrate 8 and the alignment of the mold 7 and the alignment substrate 12. The control unit 19 furthermore controls the substrate stage 5 and the mold shape correction unit based on the relative positions of the mold 7 and the substrate 8.

The following describes imprint process performed by the imprint apparatus 1. First, the substrate 8 is conveyed to the imprint apparatus 1 by a substrate conveying system, and the substrate 8 is held on the substrate stage 5. Next, the substrate stage 5 is moved such that the substrate 8 held on the substrate stage 5 is located at a resin supply position of the resin supply mechanism 6. The resin supply mechanism 6 then supplies resin 9 to a predetermined shot region on the substrate 8. Next, the substrate stage 5 is moved such that the shot region (the substrate 8) to which the resin 9 was supplied is located directly under the mold 7. The mold stage 4 holding the mold 7 is then moved in the Z axis direction (vertically downward), and the resin 9 supplied to the substrate 8 and the mold 7 (the concave-convex pattern 7a) are brought into contact (imprint operation). At this time, the resin 9 flows over the concave-convex pattern 7a on the mold 7 and fills the spaces in the concave-convex pattern 7a.

Next, while the mold 7 and the resin 9 are in contact with each other, the detection optical system 3 detects the alignment mark 10 provided on the mold 7 and the alignment mark 11 provided on the substrate 8. The mold 7 and the substrate 8 are then aligned by moving the substrate stage 5 in the X axis direction and the Y axis direction based on the detection result from the detection optical system 3. Also, the mold shape correction unit arranged on the mold stage 4 performs shape correction such as magnification correction on the mold 7. When the mold 7 and the substrate 8 have been aligned, and magnification correction has been sufficiently performed on the mold 7, the resin 9 is irradiated with light from the irradiation unit 2 so as to cure the resin 9. At this time, the detection optical system 3 is moved out of the optical path so as to prevent the detection optical system 3 from blocking the optical path of the light from the irradiation unit 2. Next, the mold 7 is detached from the cured resin 9 on the substrate 8 by moving the mold stage 4 holding the mold 7 in the Z axis direction (vertically upward) so as to widen the gap between the substrate 8 and the mold 7. Accordingly, the concave-convex pattern 7a on the mold 7 is transferred to the substrate 8 (i.e., a pattern corresponding to the concave-convex pattern 7a is formed in the resin 9).

FIG. 2 is a schematic diagram showing an example of the configuration of the detection optical system 3. The detection optical system 3 includes a detection system 21 and an illumination system 22. The detection system 21 and the illumination system 22 are configured such that a portion of the optical members constituting them is common between them.

The illumination system 22 reflects light from the light source 23 with a prism 24, guides the light onto the same optical axis as the detection system 21, and illuminates the alignment marks 10 and 11 with this light. A halogen lamp, an LED, or the like can be used as the light source 23. The light source 23 emits light having a different wavelength from the wavelength of the light emitted from the irradiation unit 2. Since ultraviolet light is used as the light emitted from the irradiation unit 2 in the present embodiment, visible light or infrared light is used as the light emitted from the light source 23.

The prism 24 is arranged at the pupil plane of the detection system 21 and the illumination system 22, or in the vicinity thereof. The alignment marks 10 and 11 are each constituted by a diffraction grating. A pattern (moiré stripes) formed by diffracted light from the alignment marks 10 and 11 illuminated by the illumination system 22 is formed by the detection system 21 on an imaging element 25 constituted by a CCD sensor or a CMOS sensor.

At its affixed faces, the prism 24 includes a reflection film 24a for reflecting light from the portion surrounding the pupil plane of the illumination system 22. The reflection film 24a functions as an aperture stop that defines the light intensity distribution of the pupil plane of the illumination system 22. Also, the reflection film 24a functions as an aperture stop that defines the size (numerical aperture) of the pupil of the detection system 21. In this way, the reflection film 24a defines the numerical aperture (detection pupil) NAo of the detection optical system 3.

The prism 24 can be replaced with a half prism that includes a semipermeable film at its affixed faces, or an optical element other than a prism, such as a plate-shaped optical element that includes a reflection film on its upper surface. Also, in order to change the shape of the pupil of the detection system 21 or the illumination system 22, a configuration is possible in which the prism 24 can be switched with another prism (a prism whose reflection film at its affixed faces includes a differently shaped aperture) by a switching mechanism such as a turret or a slide mechanism. In other words, the detection optical system 3 may include a switching mechanism that functions as a first change unit for changing the numerical aperture of the detection system 21 and a second change unit for changing the light intensity distribution of the pupil plane of the illumination system 22.

Also, the arranged position of the prism 24 is not limited to the pupil plane of the detection system 21 and the illumination system 22, or the vicinity thereof. Furthermore, the aperture stop that defines the light intensity distribution of the pupil plane of the illumination system 22 does not need to be arranged in the prism 24. For example, as shown in FIG. 3, an aperture stop 26 may be arranged in the pupil plane of the detection system 21, and an aperture stop 27 may be arranged in the pupil plane of the illumination system 22. The aperture stop 26 defines the size of the pupil of the detection system 21, and the aperture stop 27 defines the light intensity distribution of the pupil plane of the illumination system 22. In this case, a half prism that includes a semipermeable film at its affixed faces or the like is used as the prism 24. Furthermore, the aperture stop 26 and the aperture stop 27 may each be configured so as to be able to be switched with another aperture stop (an aperture stop having a differently shaped aperture) using a switching mechanism such as a turret.

The following describes details of the alignment mark 10 provided on the mold 7 and the alignment mark 11 provided on the substrate 8. A rough alignment mark is provided in the vicinity of the alignment mark 10, and the detection optical system 3 can detect this rough alignment mark at the same time as the alignment mark 10. Also, a rough alignment mark is provided in the vicinity of the alignment mark 11, and the detection optical system 3 can detect this rough alignment mark at the same time as the alignment mark 11. Here, the alignment marks 10 and 11 are constituted by diffraction gratings having mutually different pitches. Diffracted light from the alignment marks 10 and 11 therefore forms moiré stripes whose periods are different according to the difference between the pitches of the diffraction gratings. Due to the properties of the moiré stripes formed by diffracted light from the alignment marks 10 and 11, the detection optical system 3 cannot detect relative positional misalignment greater than or equal to one pitch of the diffraction gratings (several microns). In view of this, it is necessary to specify the positions of the mold 7 and the substrate 8 by detecting the rough alignment marks, and move the substrate stage 5 such that the relative positional misalignment of the mold 7 and the substrate 8 is within one pitch of the diffraction gratings. The rough alignment marks are used to specify rougher positions than the alignment marks 10 and 11.

A rough alignment mark is provided in the vicinity of the alignment mark 13 on the alignment substrate 12 as well for similar reasons. The rough alignment mark provided in the vicinity of the alignment mark 13 may have a different phase from the alignment substrate 12 even while having an uneven shape. The detection optical system 3 can detect scattered light from the rough alignment mark provided in the vicinity of the alignment mark 13.

Figure 4A:
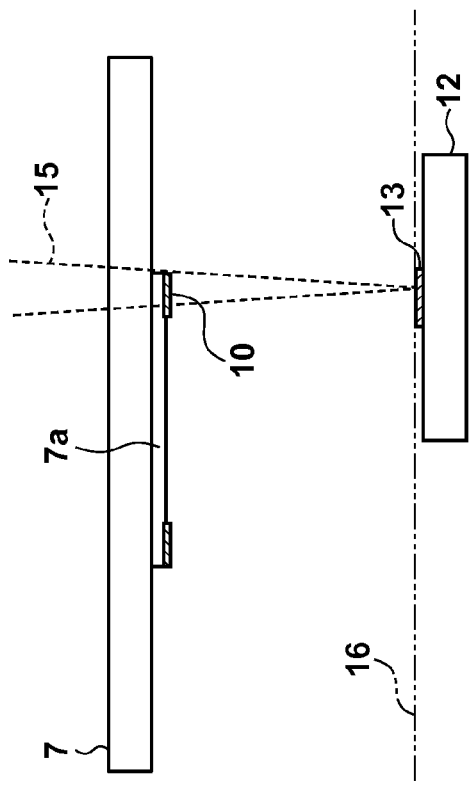
FIGS. 4A and 4B are diagrams for describing alignment of a mold and an alignment substrate according to conventional technology.
Figure 4B:
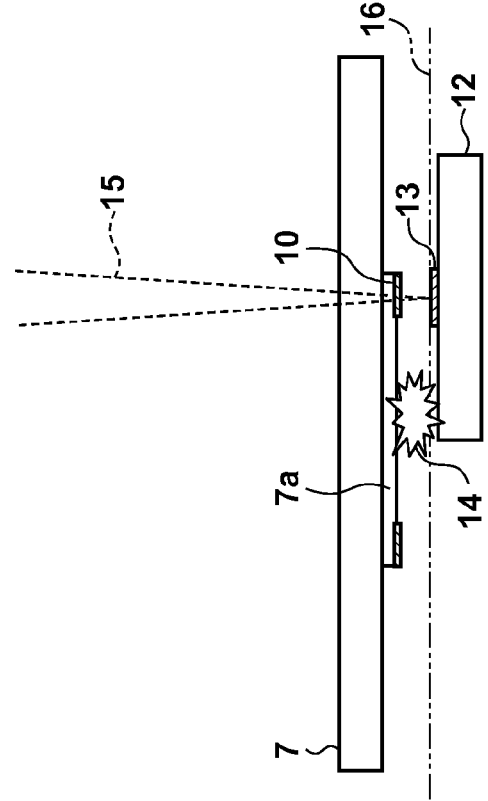

The following is a specific description of an issue regarding alignment mark detection in conventional technology. FIGS. 4A and 4B are diagrams for describing alignment of the mold 7 and the alignment substrate 12 according to conventional technology. Note that a similar issue exists even when the alignment substrate 12 is replaced with the substrate 8.

In conventional technology, as shown in FIG. 4A, the mold 7 (the mold stage 4) is moved toward the focal plane 16 of the detection optical system 3 (i.e., in the focusing direction) in order to bring the mold 7 and the alignment substrate 12 close together. While the mold 7 and the alignment substrate 12 are close together with a gap on the order of microns, the alignment mark 10 provided on the mold 7 and the alignment mark 13 provided on the alignment substrate 12 are detected by the detection optical system 3. In this way, the mold 7 and the alignment substrate 12 are brought close together in conventional technology, and therefore if a foreign particle 14 exists on the alignment substrate 12, there is a possibility of the mold 7 coming into contact with the foreign particle 14, and the mold 7 becoming damaged. This is a cause for difficulty in the alignment of the mold 7 and the alignment substrate 12.

On the other hand, as shown in FIG. 4B, a case is conceivable in which the alignment mark 10 provided on the mold 7 and the alignment mark 13 provided on the alignment substrate 12 are detected by the detection optical system 3 while the mold 7 and the alignment substrate 12 are separated from each other. In this case, light (alignment light) 15 from the detection optical system 3 passes through an edge region that includes a step portion of the mold 7, that is to say the step (boundary) between the mesa region and the off-mesa region, and therefore the detection light amount corresponding to the alignment mark 13 decreases. This is a cause for a reduction in alignment mark detection precision. Also, either the alignment mark 10 or the alignment mark 13 (in FIG. 4B, the alignment mark 10) will be detected while being separated from the focal plane 16 of the detection optical system 3. This is also a cause for a reduction in alignment mark detection precision, and there is a possibility of not being able to detect this one of the alignment marks.

The following describes the reduction in the detection light amount corresponding to an alignment mark caused by the step of the mold 7. FIG. 5A is a diagram showing a model in a two-dimensional wave optics simulation. In the present embodiment, the alignment substrate 12 and the mold 7 are constituted by quartz ($SiO_2$). The mesa region 32 of the mold 7 protrudes 30 μm from the off-mesa region 35. An edge region 31 that includes the step between the mesa region 32 and the off-mesa region 35 is modeled as a region having a curvature radius of 30 μm. FIG. 5B is an enlarged view of the mesa region 32. The concave-convex pattern 7a having a level difference of 50 nm and a pitch of 100 nm is formed in the mesa region 32. FIG. 5C is an enlarged view of the alignment mark 13. The alignment mark 13 is formed by Cr having a thickness of 100 nm.

Envisioning the case where the alignment mark 13 provided on the alignment substrate 12 is located below the mesa region 32, the edge region 31, and the off-mesa region 35, the alignment mark 13 was moved at 10 μm intervals in the simulation. As shown in FIG. 5A, a center (an edge center) 31a of the edge region 31 in the X axis direction is located between the edge of the mesa region 32 and the edge of the off-mesa region 35. The two-dimensional wave optics simulation was performed in order to investigate how the waveform obtained by detecting the alignment mark 13 with the detection optical system 3 changes according to the position of the alignment mark 13 relative to the edge center 31a (±0 μm at the position shown in FIG. 5A). In the model shown in FIG. 5A, alignment light 15 entered, and scattered light from the alignment mark 13 was detected by the detection optical system 3. Note that the gap between the mesa region 32 of the mold 7 and the alignment substrate 12 (gap distance) was 100 μm.

Figure 6:
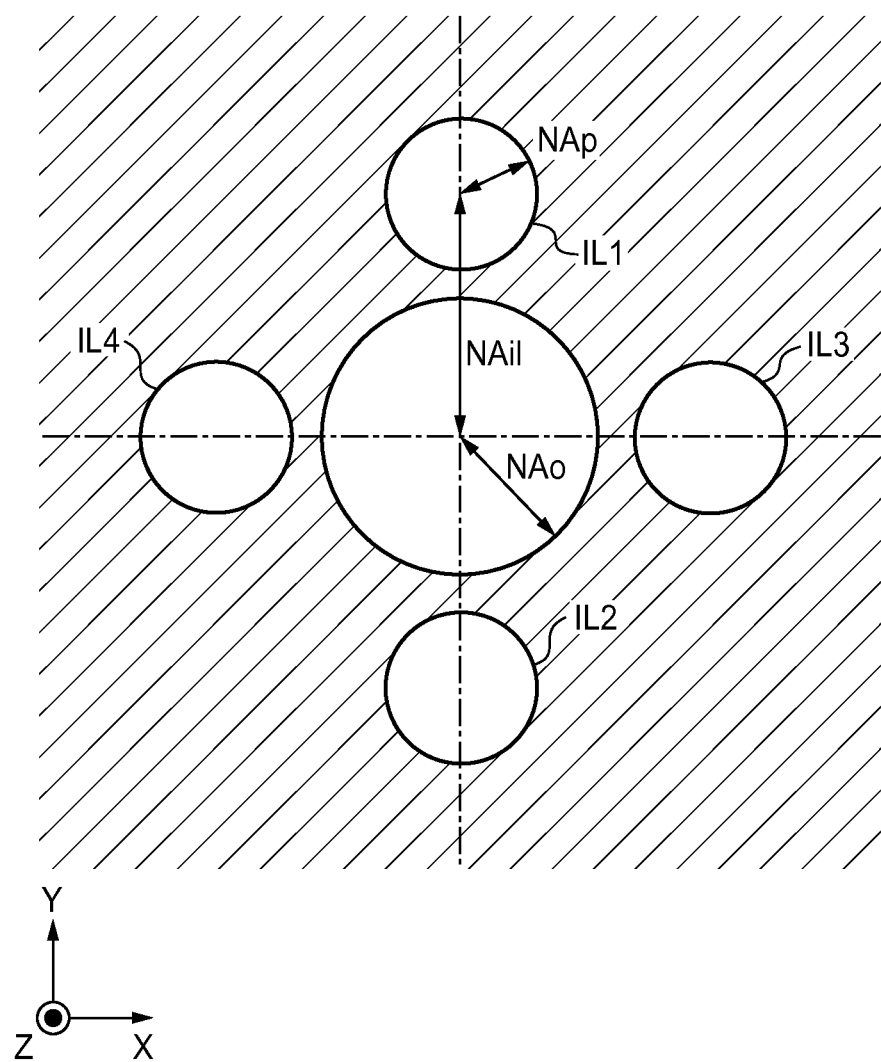
FIG. 6 is a schematic diagram showing an example of a configuration of a pupil plane of the detection optical system of the imprint apparatus shown in FIG. 1.

The following describes illumination conditions and detection conditions with respect to the alignment mark 13. The detection optical system 3 is optimized for detecting the alignment marks 10 and 11 (the moiré stripes formed by diffracted light from them) that need to be detected with higher precision than the alignment mark 13. FIG. 6 is a schematic diagram showing an example of the configuration of the pupil plane of the detection optical system 3. IL1, IL2, IL3, and IL4 used in reference to FIG. 6 indicate poles (effective light sources) where the numerical aperture (NA) is NAp and the distance from the pupil center is NAil. The effective light sources including the poles IL1 to IL4 shown in FIG. 6 are set as illumination conditions with respect to the alignment mark 13, and scattered light from the alignment mark 13 is detected by the detection pupil of the detection optical system 3 whose numerical aperture is indicated by NAo. In the simulation that was performed in the present embodiment, the NAo was 0.1, the NAp was 0.05, the NAil was 0.2, and the wavelength of the alignment light 15 was 650 nm.

Expression (1) below obtains the spread amount of the alignment light 15 when the alignment light 15 has traveled a distance equal to the gap between the alignment substrate 12 and the off-mesa region 35 of the mold 7.

Spread amount of alignment light 15=NAo×(gap between mesa region 32 of mold 7 and alignment substrate 12+protruding amount of mesa region 32 of mold 7)   (1)

In the simulation, the NAo was 0.1, the protruding amount of the mesa region 32 of the mold 7 was 30 µm, and the gap between the mesa region 32 of the mold 7 and the alignment substrate 12 was 100 µm, and therefore the spread amount of the alignment light 15 was 13 µm. The detection optical system 3 can detect the alignment mark 13 with high precision if the scattered light from the alignment mark 13 and the scattered light from the edge region 31 of the mold 7 do not overlap.

Figure 7:
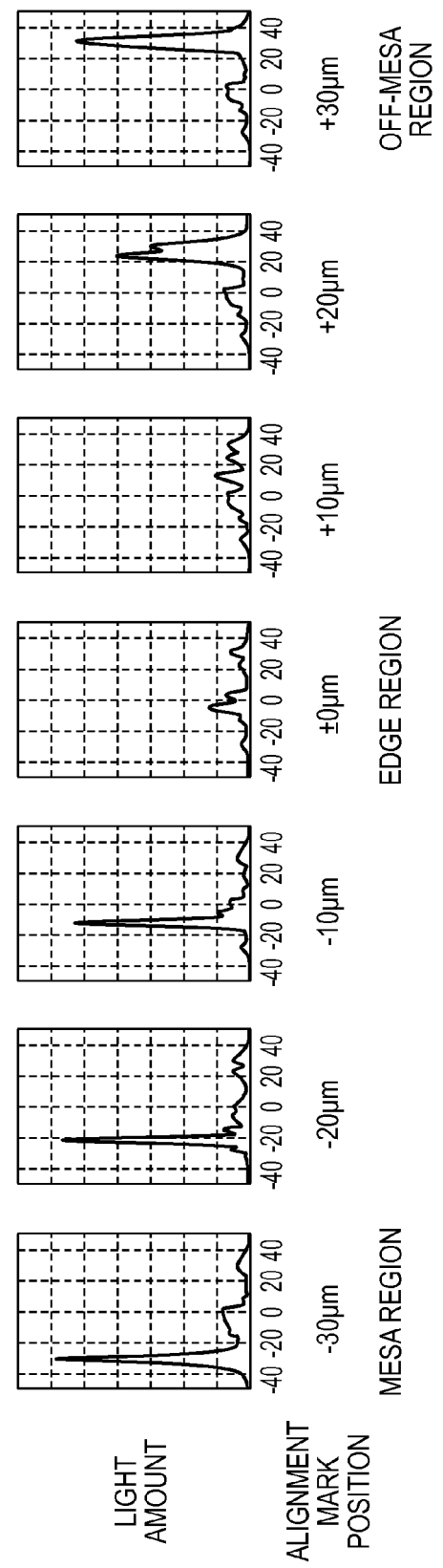
FIG. 7 is a diagram showing results of a simulation performed with the model shown in FIGS. 5A to 5C and 6.

FIG. 7 is a diagram showing results of a simulation performed with the model shown in FIGS. 5A to 5C and 6 (waveforms obtained by detecting the alignment mark 13 with the detection optical system 3). In FIG. 7, the position of the alignment mark 13 relative to the edge center 31a of the edge region 31 (range of ±30 µm in the X axis direction from the edge center 31a) is plotted on the horizontal axis, and the light amount when the alignment mark 13 was detected by the detection optical system 3 is plotted on the vertical axis. It can be understood from FIG. 7 that scattered light from the alignment mark 13 was detected in the off-mesa region 35 and the mesa region 32 separated from the edge center 31a of the edge region 31.

In the case where the gap between the mesa region 32 of the mold 7 and the alignment substrate 12 is 100 µm, the spread amount of the alignment light 15 is 13 µm as described above (based on Expression (1)). Accordingly, if the alignment mark 13 provided on the alignment substrate 12 is located at a position 13 µm or less away from the edge region 31 of the mold 7 (a range of ±15 µm from the edge center 31a), detection is influenced by scattering in the edge region 31. For this reason, it is thought that alignment mark 13 imaging performance decreases in the vicinity of the edge center 31a of the edge region 31 of the mold 7 as shown in FIG. 7.

Also, the alignment light 15 undergoes scattering in the edge region 31 of the mold 7 also when the alignment mark 13 provided on the alignment substrate 12 is illuminated. Accordingly, the light amount decreases in the portion corresponding to the shadow of the edge region 31 of the mold 7, and therefore if the alignment mark 13 is located underneath this portion, the light amount of the alignment light 15 illuminating the alignment mark 13 decreases. Accordingly, the light amount of scattered light from the alignment mark 13 also decreases, and this is thought to make detection of the alignment mark 13 difficult.

In the case where the alignment mark 13 is located at a position −10 µm from the edge center 31a of the edge region 31 of the mold 7, it is thought that scattered light from the alignment mark 13 is influenced by scattering caused by the edge region 31. However, in the simulation, the alignment mark 13 (a peak corresponding thereto) was detected as shown in FIG. 7. This is thought to be due to the fact that the illumination condition with respect to the alignment mark 13 is oblique incident illumination (11.5 degrees), and at a position −10 µm from the edge center 31a of the edge region 31 of the mold 7, the influence of scattering caused by the edge region 31 on the alignment light 15 is small.

Also, the light amount of light detected by the detection optical system 3 (scattered light from the alignment mark 13) changes according to the wavelength of the alignment light 15 and the thickness (step amount) of the alignment mark 13 as well. Accordingly, the light amount of the scattered light from the alignment mark 13 detected by the detection optical system 3 can be adjusted by changing the wavelength of the alignment light 15.

The following describes alignment of the mold 7 and the alignment substrate 12 according to the present embodiment with reference to FIGS. 8A and 8B. In the alignment of the mold 7 and the alignment substrate 12, as described above, the detection optical system 3 needs to perform detection process for detecting the alignment mark 10 provided on the mold 7 and the alignment mark 13 provided on the alignment substrate 12. This detection process is performed by the control unit 19 controlling the positioning of the mold stage 4 and the substrate stage 5 and the detection performed by the detection optical system 3.

In the present embodiment, first, the substrate stage 5 is moved so as to move the alignment substrate 12 out of the way as shown in FIG. 8A. Due to moving the alignment substrate 12 out of the way, the alignment mark 13 (reference mark) can be positioned outside the field of view of the detection optical system 3. The direction in which the substrate stage 5 is moved may be a horizontal direction (the X axis direction or the Y axis direction), or the vertical direction (the Z axis direction). Also, the mold stage 4 is positioned such that mold 7 (the alignment mark 10 provided thereon) is located in the focal plane 16 of the detection optical system 3 (i.e., the mold stage 4 is moved so as to bring the mold 7 close to the focal plane 16). Since the alignment substrate 12 has been moved out of the way at this time, even if a foreign particle exists on the alignment substrate 12, the mold 7 will not become damaged. In this state, the alignment mark 10 provided on the mold 7 is detected by the detection optical system 3 and acquired as a position relative to the detection optical system 3 (the imaging element 25). In this way, the detection optical system 3 is caused to detect the alignment mark 10 in the state in which the substrate stage 5 has been positioned such that the alignment mark 13 is located outward of a field of view 47 (i.e., outside the field of view) of the detection optical system 3 (first detection process).

Next, as shown in FIG. 8B, the mold stage 4 is moved in the vertical direction so as to move the mold 7 out of the way. Here, the mold stage 4 (the mold 7) is moved in the vertical direction by a distance longer than the distance corresponding to the dimensions of a foreign particle (envisioned foreign particle) that exists on the alignment substrate 12 or the alignment mark 13. Also, the substrate stage 5 is positioned such that the alignment substrate 12 (the alignment mark 13 provided thereon) is located in the focal plane 16 of the detection optical system 3 (i.e., the mold stage 4 is moved so as to bring the alignment substrate 12 close to the focal plane 16). In this state, the alignment mark 13 provided on the alignment substrate 12 is detected by the detection optical system 3 and acquired as a position relative to the detection optical system 3 (the imaging element 25). In this way, the mold stage 4 is positioned such that the alignment mark 10 is out of focus with respect to the detection optical system 3, and the substrate stage 5 is positioned such that the alignment mark 13 is located inward of the field of view 47 (in the field of view) of the detection optical system 3. The detection optical system 3 is then caused to detect the alignment mark 13 in this state (second detection process).

In the present embodiment, the detection optical system 3 is fixed at the same position (i.e., the detection optical system 3 is not moved) in the first detection process shown in FIG. 8A and the second detection process shown in FIG. 8B. This therefore makes it possible to obtain the relative positions of the alignment mark 10 detected in the first detection process and the alignment mark 13 detected in the second detection process. Also, since error does not occur due to movement of the detection optical system 3, the alignment marks 10 and 13 can be detected with high precision. Note that even in the case where the detection optical system 3 is moved between the first detection process and the second detection process, it is possible to obtain the relative positions of the alignment mark 10 and the alignment mark 13 if the amount of movement is obtained, and thus there is no need to fix the detection optical system 3 at the same position.

Also, when performing the second detection process, the substrate stage 5 is positioned such that light (alignment light 15) from the alignment mark 13 passes through the region of the mold 7 other than the edge region that includes the step between the mesa region and the off-mesa region of the mold 7. Specifically, in the present embodiment, as shown in FIG. 8B, the substrate stage 5 is positioned such that light from the alignment mark 13 passes through the off-mesa region of the mold 7. Accordingly, there is no influence of dispersion by the edge region of the mold 7, and the alignment mark 13 imaging performance does not decrease. Note that when performing the second detection process, the substrate stage 5 may be positioned such that light from the alignment mark 13 passes through the mesa region of the mold 7. Note that in this case, the substrate stage 5 needs to be positioned such that the light passes through a region of the mesa region of the mold 7 in which the pitch of the concave-convex pattern 7a is lower than or equal to the wavelength of the light (alignment light 15) from the alignment mark 13.

The field of view of the detection optical system 3 can be changed using the magnification ratio of the detection system 21 and the size of the imaging element 25, and is set to 500 µm² in the present embodiment. The spread amount of the alignment light 15 is obtained using Expression (1), and is 13 µm to 23 µm in the case where the NAo is 0.1, the gap between the mesa region of the mold 7 and the alignment substrate 12 is 100 µm to 200 µm, and the protruding amount of the mesa region 32 of the mold 7 is 30 µm, for example. Accordingly, within the field of view of the detection optical system 3, the alignment mark 10 provided on the mold 7 and the alignment mark 13 provided on the alignment substrate 12 can be sufficiently detected using the position of the detection optical system 3 (the imaging element 25) as a reference.

Figure 9:
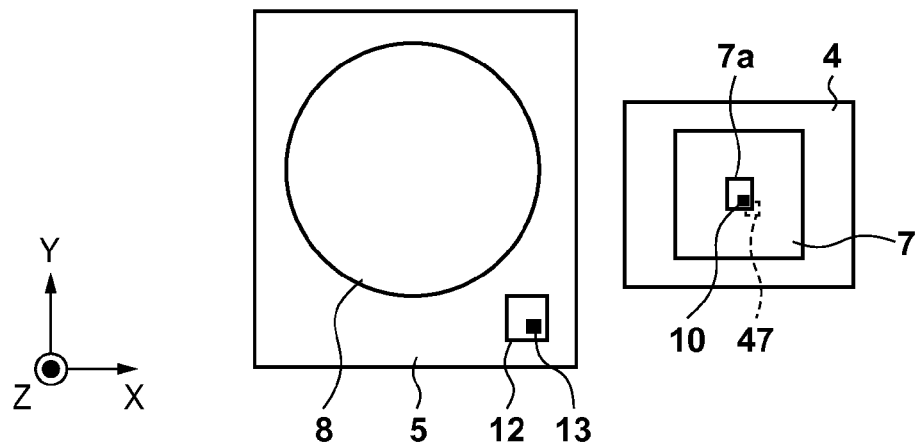
FIG. 9 is a diagram in which the positional relationship between a mold stage and a substrate stage in first detection process is shown from the Z axis direction.

FIG. 9 is a diagram in which the positional relationship between the mold stage 4 and the substrate stage 5 in first detection process is shown from the Z axis direction. The mold stage 4 (the mold 7) and the substrate stage 5 (the substrate 8 and the alignment substrate 12) move independently from each other. In the first detection process, the substrate stage 5 is moved out of the way to a position of not interfering with the mold stage 4 and the mold 7, the alignment mark 10 provided on the mold 7 is arranged in the field of view 47 of the detection optical system 3, and then the alignment mark 10 is detected by the detection optical system 3. Then, in the second detection process, the mold stage 4 (the mold 7) is moved in the vertical direction, thereafter the substrate stage 5 is moved so as to arrange the alignment mark 13 in the field of view 47 of the detection optical system 3, and then the alignment mark 13 is detected by the detection optical system 3.

In FIG. 9, one alignment mark 13 is provided on the alignment substrate 12, and one alignment mark 10 is provided on the mold 7. Note that a plurality of alignment marks 13 may be provided on the alignment substrate 12, and a plurality of alignment marks 10 may be provided on the mold 7. In this case, the imprint apparatus 1 includes a plurality of detection optical systems 3, and these detection optical systems 3 detect corresponding alignment marks 13 and 10. This therefore makes it possible to obtain error such as a shift component and a rotation component between the alignment marks 13 provided on the alignment substrate 12 and the alignment marks 10 provided on the mold 7. Accordingly, it is possible to obtain the shape of the mold 7 based on the detection results from the plurality of detection optical systems 3, and correct the shape of the mold 7 using the mold shape correction unit arranged on the mold stage 4 based on the obtained shape of the mold 7.

Figure 10A:
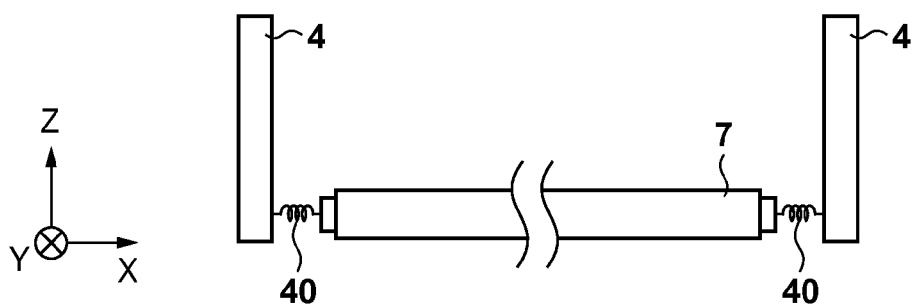
FIGS. 10A and 10B are diagrams showing examples of a configuration of a mold shape correction unit arranged on the mold stage of the imprint apparatus shown in FIG. 1.
Figure 10B:
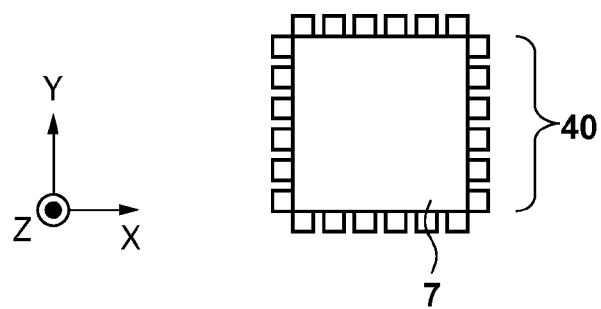

FIGS. 10A and 10B are diagrams showing examples of the configuration of the mold shape correction unit 40 arranged on the mold stage 4. The mold shape correction unit 40 is constituted with a spring structure arranged (sandwiched) between the mold 7 and the mold stage 4 as shown in FIG. 10A, for example. The mold shape correction unit 40 shown in FIG. 10A can deform the shape of the mold 7 by changing the intensity of the clamping of the spring structure. Also, the mold shape correction unit 40 may be constituted with a plurality of spring structures arranged (sandwiched) between the mold 7 and the mold stage 4 as shown in FIG. 10B, for example. The mold shape correction units 40 shown in FIG. 10B can deform the shape of the mold 7 with higher precision by changing the intensity of the sandwiching of the respective spring structures.

Also, although the second detection process is performed after performing the first detection process in the present embodiment, there is no influence on the precision of detection of the alignment marks 10 and 13 even if the first detection process is performed after performing the second detection process. Accordingly, it may be possible to select one of multiple detection modes in which detection process is performed, including a mode of performing the second detection process after performing the first detection process, and a mode of performing the first detection process after performing the second detection process. This selection need only be made with consideration given to throughput, for example.

In this way, according to the imprint apparatus 1, it is possible to highly precisely align the mold 7 and the alignment substrate 12 without damaging the mold 7. Accordingly, the imprint apparatus 1 enables highly precisely aligning the mold 7 and the substrate 8, and makes it possible for articles such as high-quality semiconductor devices to be provided economically and with high throughput.

Second Embodiment

Figure 11:
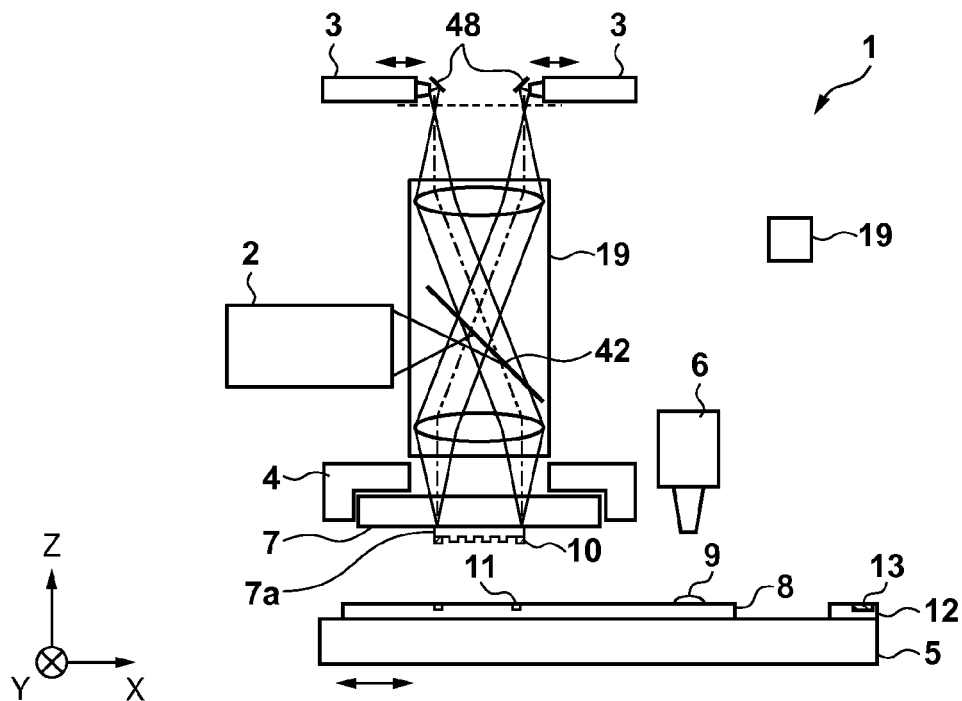
FIG. 11 is a schematic diagram showing another configuration of an imprint apparatus according to an aspect of the present invention.

FIG. 11 is a schematic diagram showing another configuration of the imprint apparatus 1 according to an aspect of the present invention. As shown in FIG. 11, in the present embodiment, the imprint apparatus 1 further includes a projection optical system 41. The projection optical system 41 includes a dichroic mirror 42, and is arranged above the mold 7, specifically between the mold 7 and the detection optical system 3. The projection optical system 41 projects light from the irradiation unit 2 onto the substrate. Also, the projection optical system 41 projects images of the alignment mark 10 provided on the mold 7, the alignment mark 11 provided on the substrate 8, and the alignment mark 13 provided on the alignment substrate 12 onto the projection plane. Here, the projection plane is provided between the detection optical system 3 and the projection optical system 41, and the detection optical system 3 detects the alignment marks 10, 11, and 13 projected on the projection plane.

The dichroic mirror 42 is an optical member that selectively reflects or transmits light according to the wavelength. In the present embodiment, the dichroic mirror 42 is configured so as to reflect light for curing the resin 9 on the substrate 8 (ultraviolet light from the irradiation unit 2), and transmit alignment light 15 corresponding to the alignment marks 10, 11, and 13 (visible light or infrared light from the detection optical system 3).

The detection optical system 3 detects the alignment marks 10, 11, and 13 via the projection optical system 41 that includes the dichroic mirror 42 (i.e., detects images of moiré stripes projected on the projection plane of the projection optical system 41). In other words, the detection optical system 3 detects the relative positions of the mold 7 and the substrate 8, the relative positions of the mold 7 and the alignment substrate 12, and the like via the projection optical system 41.

The irradiation unit 2 irradiates the dichroic mirror 42 with ultraviolet light from beside the projection optical system 41. The ultraviolet light reflected by the dichroic mirror 42 passes through the projection optical system 41, and the concave-convex pattern 7a on the mold 7 is irradiated with this ultraviolet light evenly with a predetermined shape. Accordingly, in the projection optical system 41, the optical members arranged between the dichroic mirror 42 and the mold 7 are constituted by quartz or the like that transmits ultraviolet light.

According to this configuration, in the present embodiment, even when using the detection optical system 3 arranged such that the optical axis is perpendicular to the mold 7 and the substrate 8, the detection optical system 3 does not need to be moved out of the way when emitting ultraviolet light from the irradiation unit 2. This eliminates the need for time to move the detection optical system 3 out of the way when curing the resin 9 on the substrate 8, thus making it possible to improve the throughput of the imprint apparatus 1.

Note that the dichroic mirror 42 may be configured so as to transmit light for curing the resin 9 on the substrate 8 (ultraviolet light), and reflect alignment light 15 corresponding to the alignment marks 10, 11, and 13 (visible light or infrared light). In this case, the optical path of the projection optical system 41 is bent by the dichroic mirror 42, and the positional relationship between the irradiation unit 2 and the detection optical system 3 is the opposite of that shown in FIG. 11. In other words, the irradiation unit 2 is arranged above the mold 7.

Also, in the present embodiment, bending mirrors 48 are arranged in the vicinity of the projection plane of the projection optical system 41. Light from the detection optical system 3 and diffracted light from the alignment marks 10, 11, and 13 are bent by the bending mirrors 48 to a direction parallel with the XY plane at a position at which the luminous flux diameter is small. Accordingly, even in the case where the diameter of the projection optical system 41 is increased by increasing the size of the projection optical system 41 and the numerical aperture of the detection optical system 3 in order to increase the width of the detected wavelength range and the illumination light amount, the detection optical system 3 can be arranged so as to be adjacent in the X axis direction and the Y axis direction. This therefore makes it possible to raise the degree of freedom in the layout of the alignment marks 10, 11, and 13.

In the case where the projection optical system 41 is not provided, the detection optical system 3 needs to be arranged at a position separated from the mold 7, or the diameter needs to be reduced, in order to avoid interfering with the mold shape correction unit and the mold driving mechanism included in the mold stage 4. If the detection optical system 3 is arranged at a position separated from the mold 7, the diameter of luminous flux increases, and therefore the detection optical system 3 increases in size, the cost of the detection optical system 3 rises, and the limitations on the arrangement of the alignment marks 10, 11, and 13 become stricter. On the other hand, if the diameter of the detection optical system 3 decreases, the numerical aperture of the detection optical system 3 decreases, thus inviting a decrease in the amount of illumination light that illuminates the alignment marks and a narrower range of detected wavelengths, and reducing the precision of detection of the alignment marks 10, 11, and 13.

In the present embodiment, the provision of the projection optical system 41 makes it possible to avoid interference between the detection optical system 3 and the mold driving mechanism and the mold shape correction unit and avoid limitations on the arrangement of the alignment marks 10, 11, and 13, and to increase the numerical aperture of the detection optical system 3. Accordingly, in the present embodiment, it is possible to widen the detected wavelength range of the detection optical system 3 and increase the illumination light amount, and it is possible to highly precisely detect the alignment marks 10, 11, and 13.

With the imprint apparatus shown in FIG. 11 as well, similarly to the first embodiment (see FIGS. 8A and 8B), the mold 7 and the alignment substrate 12 can be aligned highly precisely. The following describes the gap between the mesa region 32 of the mold 7 and the alignment substrate 12 when detecting light from the alignment mark 13 that has passed through the off-mesa region of the mold 7. If the numerical aperture NAo of the detection optical system 3 is sufficiently small, the spread amount of the alignment light 15 is obtained by Expression (1) as described above. For example, if the NAo is 0.1, and the gap between the mesa region 32 of the mold 7 and the alignment substrate 12 is 200 μm, the spread amount of the alignment light 15 is 23 μm based on Expression (1). Accordingly, if the gap between the edge center of the edge region of the mold 7 and the alignment mark 13 in the X axis direction is set to 23 μm or more, the alignment light 15 is not influenced by diffusion by the edge region of the mold 7, thus making it possible to avoid a reduction in the alignment mark 13 imaging performance.

Figure 12:
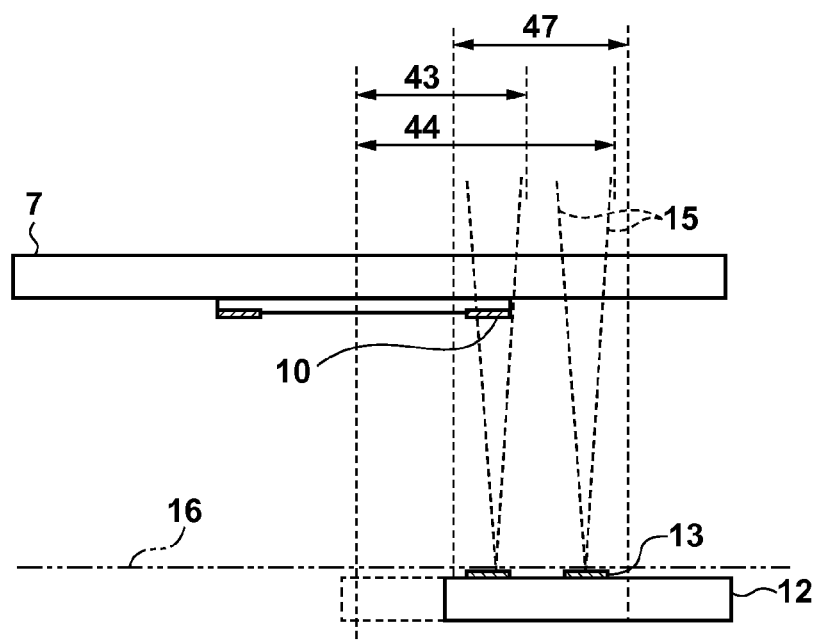
FIG. 12 is a diagram showing the positional relationship between the mold and an alignment mark provided on the alignment substrate.

Note that in this case, the effective diameter of the common optical path of the detection system 21 and the illumination system 22 of the detection optical system 3 needs to be increased according to the position of the alignment mark 13. As shown in FIG. 12, in the case of detecting light from the alignment mark 13 (alignment light 15) that has traveled inward of the mesa region of the mold 7, the width of the alignment light 15 when passing through the projection optical system 41 is schematically indicated by a width 43. Also, in the case of detecting light from the alignment mark 13 that has passed through the off-mesa region of the mold 7, the width of the alignment light 15 when passing through the projection optical system 41 is schematically indicated by a width 44. Accordingly, in order to detect light from the alignment mark 13 that has passed through the off-mesa region of the mold 7, the effective diameter of the projection optical system 41 needs to be increased by an amount corresponding to the gap between the edge center of the edge region of the mold 7 and the alignment mark 13. The amount of increase in the effective diameter of the projection optical system 41 is determined according to the position of the alignment mark 13 and the spread amount of the alignment light 15 obtained by Expression (1).

Figure 13:
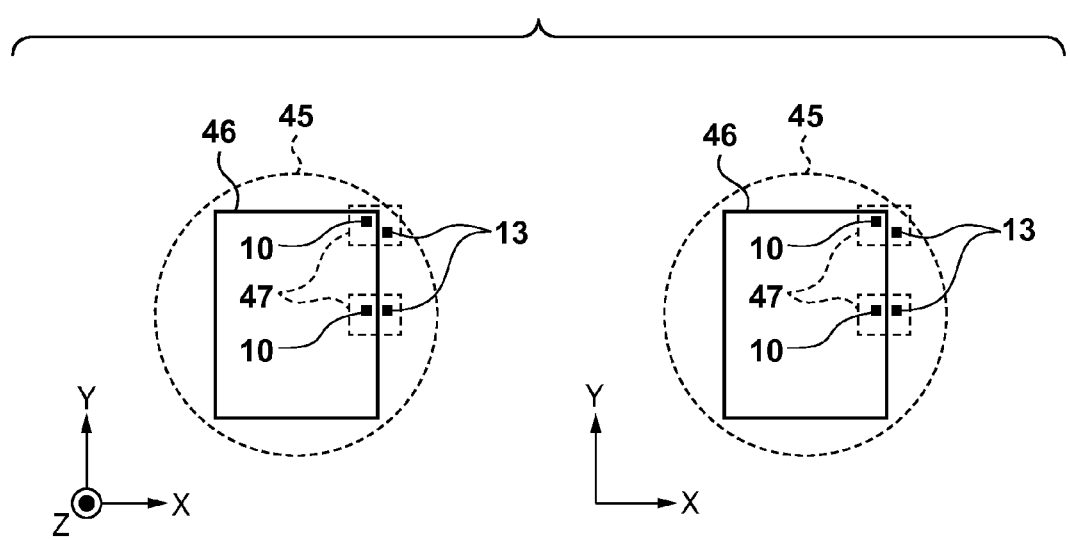
FIG. 13 is a diagram in which the positional relationship between an alignment mark provided on the mold and the alignment mark provided on the alignment substrate in second detection process is shown from the Z axis direction.

FIG. 13 is a diagram in which the positional relationship between the alignment mark 10 provided on the mold 7 and the alignment mark 13 provided on the alignment substrate 12 in second detection process is shown from the Z axis direction. FIG. 13 shows the alignment mark 10 provided on the mold 7, the alignment mark 13 provided on the alignment substrate 12, the effective diameter 45 of the projection optical system 41, the step (edge) 46 between the mesa region and the off-mesa region of the mold 7, and the field of view 47 of the detection optical system 3. As shown in FIG. 13, the alignment marks 10 and 13 are arranged in the vicinity of the edge 46 of the mold 7. In the case where the alignment marks 10 and 13 are arranged at a corner of the edge 46 of the mold 7, the field of view 47 of the detection optical system 3 does not entirely fit within the effective diameter 45 of the projection optical system 41, and there is a possibility of not being able to detect an alignment mark with the detection optical system 3. If the alignment mark 13 is arranged in this range, the alignment mark 13 cannot be detected. In view of this, as shown in FIG. 13, if the alignment mark 13 is arranged (positioned) in the detectable range of the detection optical system 3, the alignment mark 13 can be detected. In this way, the positions of the alignment marks 10 and 13 with respect to the field of view 47 of the detection optical system 3 can be changed according to the position of the alignment mark 10.

Also, if the imprint apparatus 1 includes two or more detection optical systems 3, corresponding alignment marks 10 and 13 can be detected in the fields of view of the respective detection optical systems 3. The shape of the mold 7 can be obtained by detecting the gap between the mold 7 and the alignment substrate 12 at two or more positions. Here, the higher the number of locations at which the gap between the mold 7 and the alignment substrate 12 is measured, the more highly precisely the shape of the mold 7 can be obtained. The mold shape correction unit corrects the shape of the mold 7 to a predetermined shape based on the shape of the mold 7 obtained in this way.

Third Embodiment

Figure 14:
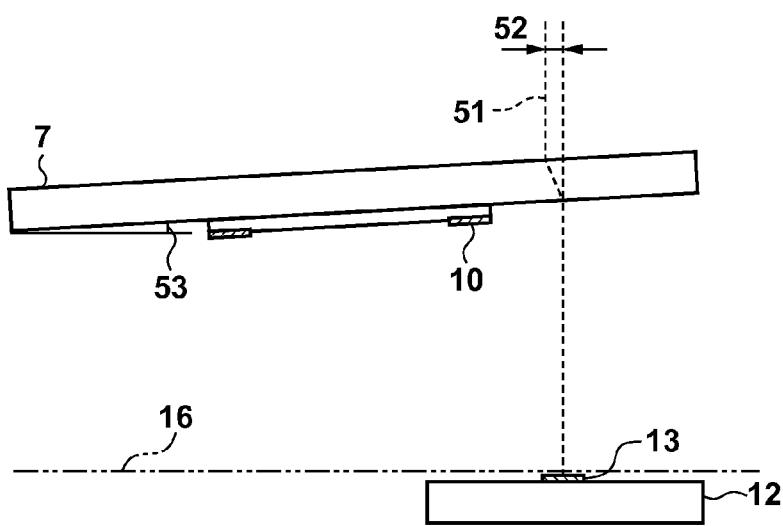
FIG. 14 is a diagram for describing alignment mark detection error in the second detection process.

The present embodiment describes error when detecting the alignment mark 13 (detection error) in the first embodiment and the second embodiment. In the second detection process shown in FIG. 8B, if the mold 7 becomes inclined when the mold 7 is moved out of the way, detection error will arise with respect to the alignment mark 13. For example, as shown in FIG. 14, if the mold 7 is inclined at an angle 53 relative to the horizontal direction, light 51 from the alignment mark 13 is refracted by the mold 7 and becomes shifted by a gap 52. Accordingly, when the alignment mark 13 is detected in the alignment of the mold 7 and the alignment substrate 12, an amount of detection error corresponding to the gap 52 arises. For this reason, when the mold 7 is moved out of the way (i.e., when the mold 7 is moved in the Z axis direction), the mold stage 4 needs to be able to suppress the inclination angle (inclination amount) of the mold 7 to a low angle.

Letting $\theta 1$ be the inclination angle of the mold 7, t be the thickness of the mold 7, n be the refractive index of the mold 7, and $\theta 2$ be the angle of refraction of light incident on the mold 7, the shift amount of the light 51 from the alignment mark 13 is obtained by Expression (2) below.

$$\text{shift amount} = t \times \sin(\theta 1 - \theta 2)/\cos \theta 2 \quad (2)$$

Also, taking Snell's law ($\sin \theta 1 = n \times \sin \theta 2$) into consideration, if $\theta 1$ is 1 minute, t is 1 mm, and n is 1.45, the shift amount of the light 51 from the alignment mark 13 is obtained as 90 nm according to Expression (2). The shift amount of the light 51 from the alignment mark 13 hinders highly precise alignment of the mold 7 and the alignment substrate 12 (becomes alignment error), and therefore the inclination angle of the mold 7 needs to be suppressed according to the alignment precision that is needed.

Fourth Embodiment

The present embodiment describes a method of manufacturing a device (semiconductor device, magnetic storage medium, liquid crystal display element, or the like) as an article. This manufacturing method includes a step of forming a pattern on a substrate (wafer, glass plate, film-like substrate, or the like) using the imprint apparatus 1. This manufacturing method further includes a step of processing the substrate provided with the pattern. This processing step can include a step of removing a remaining film of the pattern. It can also include other widely-known steps, such as a step of etching the substrate using the pattern as a mask. The method of manufacturing an article of the present embodiment is advantageous over conventional technology in at least one of article performance, quality, productivity, and production cost.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-000651 filed on Jan. 6, 2014, which is hereby incorporated by reference herein in its entirety.

What is claimed is:

1. An imprint apparatus that performs imprint process for forming a pattern on a substrate using a mold, the imprint apparatus comprising:
    a mold stage configured to hold the mold;
    a substrate stage, on which a reference mark is provided, configured to hold the substrate;
    a detection optical system configured to detect a mold-side mark provided on the mold, the reference mark, and an alignment mark provided on the substrate; and
    a control unit configured to control a detection process including positioning of the mold stage and the substrate stage and detection performed by the detection optical system for alignment of the mold and the substrate,
    wherein the detection process
    causes the detection optical system to detect the mold-side mark and the alignment mark in a first state in which the mold-side mark and the alignment mark are spaced apart from each other and are in focus with respect to the detection optical system, and
    includes a process of detecting the mold-side mark and the reference mark, the process including a first detection process in which the detection optical system is caused to detect the mold-side mark in a second state in which the substrate stage is positioned such that the reference mark is located outside a field of view of the detection optical system and the mold stage is positioned such that the mold-side mark is located in a focal plane of the detection optical system, and a second detection process in which the detection optical system is caused to detect the reference mark in a third state in which the mold stage is at a position where the mold-side mark is spaced apart from the focal plane of the detection optical system and is out of focus with respect to the detection optical system, and the substrate stage is positioned such that the reference mark is located inside the field of view of the detection optical system.

2. An imprint apparatus that performs imprint process for forming a pattern on a substrate using a mold, the imprint apparatus comprising:
 a mold stage configured to hold the mold;
 a substrate stage, on which a reference mark is provided, configured to hold the substrate;
 a detection optical system configured to detect a mold-side mark provided on the mold, the reference mark, and an alignment mark provided on the substrate; and
 a control unit configured to control a detection process including positioning of the mold stage and the substrate stage and detection performed by the detection optical system for alignment of the mold and the substrate,
 wherein the detection process
 causes the detection optical system to detect the mold-side mark and the alignment mark in a first state in which the mold-side mark and the alignment mark are spaced apart from each other and are in focus with respect to the detection optical system, and
 includes a process of detecting the mold-side mark and the reference mark, the process including a first detection process in which the detection optical system is caused to detect the mold-side mark in a second state in which the substrate stage is positioned such that the reference mark is located outside a field of view of the detection optical system and the mold stage is positioned such that the mold-side mark is located in a focal plane of the detection optical system, and a second detection process in which the detection optical system is caused to detect the reference mark in a third state in which the mold stage is at a position where the mold-side mark is spaced apart from the focal plane of the detection optical system and is out of focus with respect to the detection optical system, and the substrate stage is positioned such that the reference mark is located inside the field of view of the detection optical system,
 wherein the mold includes a mesa region having therein a pattern that corresponds to the pattern to be formed on the substrate, and an off-mesa region that surrounds the mesa region, and
 the control unit is configured to position the substrate stage such that light from the reference mark passes through a region of the mold except for a region that includes the mesa region and a boundary between the mesa region and the off-mesa region to perform the second detection process.

3. An imprint apparatus that performs imprint process for forming a pattern on a substrate using a mold, the imprint apparatus comprising:
 a mold stage configured to hold the mold;
 a substrate stage, on which a reference mark is provided, configured to hold the substrate;
 a detection optical system configured to detect a mold-side mark provided on the mold, the reference mark, and an alignment mark provided on the substrate; and
 a control unit configured to control a detection process including positioning of the mold stage and the substrate stage and detection performed by the detection optical system for alignment of the mold and the substrate,
 wherein the detection process
 causes the detection optical system to detect the mold-side mark and the alignment mark in a first state in which the mold-side mark and the alignment mark are spaced apart from each other and are in focus with respect to the detection optical system, and
 includes a process of detecting the mold-side mark and the reference mark, the process including a first detection process in which the detection optical system is caused to detect the mold-side mark in a second state in which the substrate stage is positioned such that the reference mark is located outside a field of view of the detection optical system and the mold stage is positioned such that the mold-side mark is located in a focal plane of the detection optical system, and a second detection process in which the detection optical system is caused to detect the reference mark in a third state in which the mold stage is at a position where the mold-side mark is spaced apart from the focal plane of the detection optical system and is out of focus with respect to the detection optical system, and the substrate stage is positioned such that the reference mark is located inside the field of view of the detection optical system,
 wherein the mold includes a mesa region having therein a pattern that corresponds to the pattern to be formed on the substrate, and
 the control unit is configured to position the substrate stage such that light from the reference mark passes through a region of the mesa region in which a pitch of the pattern is not greater than a wavelength of the light from the reference mark to perform the second detection process.

4. The imprint apparatus according to claim 1, wherein the control unit is configured to select one of a plurality of detection modes in which the detection process is performed, including a mode in which the second detection process is performed after the first detection process is performed, and a mode in which the first detection process is performed after the second detection process is performed.

5. The imprint apparatus according to claim 1, wherein the detection optical system is fixed at the same position in the first detection process and the second detection process.

6. The imprint apparatus according to claim 1,
 wherein the imprint apparatus comprises a plurality of the detection optical system, and
 the plurality of the detection optical system respectively detect a plurality of the mold-side mark provided on the mold and a corresponding plurality of the reference mark provided on the substrate stage.

7. The imprint apparatus according to claim 6,
 wherein the control unit is configured to obtain a shape of the mold based on the plurality of the mold-side mark and the plurality of the reference mark respectively detected by the plurality of the detection optical system, and
 the imprint apparatus further comprises a correction unit configured to correct the shape of the mold based on the shape of the mold obtained by the control unit.

8. The imprint apparatus according to claim 1, further comprising:
 a first change unit configured to change a numerical aperture of a detection system in the detection optical system; and a second change unit configured to change a light intensity distribution of a pupil plane of an illumination system in the detection optical system.

9. The imprint apparatus according to claim 1, further comprising:
an irradiation unit configured to irradiate light for curing an imprint material on the substrate; and
a projection optical system arranged between the mold and the detection optical system and configured to project light from the irradiation unit onto the substrate,
wherein the detection optical system is configured to detect the mold-side mark and the reference mark via the projection optical system.

10. An imprint method of performing imprint process for forming a pattern on a substrate using a detection optical system and a mold, the method comprising:
a step of performing a detection process including positioning of a mold stage that holds the mold, positioning of a substrate stage, on which a reference mark is provided and that holds the substrate, and detection performed by the detection optical system,
wherein the detection process
causes the detection optical system to detect a mold-side mark provided on the mold, the reference mark, and an alignment mark provided on the substrate, and
causes the detection optical system to detect the mold-side mark and the alignment mark in a first state in which the mold-side mark and the alignment mark are spaced apart from each other and are in focus with respect to the detection optical system, and
includes a process of detecting the mold-side mark and the reference mark, the process including a first detection process in which the detection optical system is caused to detect the mold-side mark in a second state in which the substrate stage is positioned such that the reference mark is located outside a field of view of the detection optical system and the mold stage is positioned such that the mold-side mark is in focus with respect to the detection optical system, and a second detection process in which the detection optical system is caused to detect the reference mark in a third state in which the mold stage is at a position where the mold-side mark is spaced apart from the focal plane of the detection optical system and is out of focus with respect to the detection optical system, and the substrate stage is positioned such that the reference mark is located inside the field of view of the detection optical system.

11. A method of manufacturing an article, the method comprising steps of:
forming a pattern on a substrate using an imprint apparatus; and
processing the substrate on which the pattern has been formed, to manufacturing the article,
wherein the imprint apparatus performs imprint process for forming a pattern on the substrate using a mold, and includes:
a mold stage configured to hold the mold;
a substrate stage, on which a reference mark is provided, configured to hold the substrate;
a detection optical system configured to detect a mold-side mark provided on the mold, the reference mark, and an alignment mark provided on the substrate; and
a control unit configured to control a detection process including positioning of the mold stage and the substrate stage and detection performed by the detection optical system for alignment of the mold and the substrate,
wherein the detection process
causes the detection optical system to detect the mold-side mark and the alignment mark in a first state in which the mold-side mark and the alignment mark are spaced apart from each other and are in focus with respect to the detection optical system, and
includes a process of detecting the mold-side mark and the reference mark, the process including a first detection process in which the detection optical system is caused to detect the mold-side mark in a second state in which the substrate stage is positioned such that the reference mark is located outside a field of view of the detection optical system and the mold stage is positioned such that the mold-side mark is located in focus with respect to the detection optical system, and a second detection process in which the detection optical system is caused to detect the reference mark in a third state in which the mold stage is at a position where the mold-side mark is spaced apart from the focal plane of the detection optical system and is out of focus with respect to the detection optical system, and the substrate stage is positioned such that the reference mark is located inside the field of view of the detection optical system.

12. The apparatus according to claim 1, wherein each of the mold-side mark, the reference mark and the alignment mark includes a mark for rough alignment.

* * * * *